United States Patent
Sun et al.

(10) Patent No.: US 9,302,901 B2
(45) Date of Patent: Apr. 5, 2016

(54) MICRO-ELECTRO-MECHANICAL SYSTEM DEVICE WITH ENHANCED STRUCTURAL STRENGTH

(71) Applicants: Chih-Ming Sun, Hsin-Chu (TW); Ming-Han Tsai, Hsin-Chu (TW); Hsin-Hui Hsu, Hsin-Chu (TW); WeiChung Wang, Hsin-Chu (TW)

(72) Inventors: Chih-Ming Sun, Hsin-Chu (TW); Ming-Han Tsai, Hsin-Chu (TW); Hsin-Hui Hsu, Hsin-Chu (TW); WeiChung Wang, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

(21) Appl. No.: 14/505,022

(22) Filed: Oct. 2, 2014

(65) Prior Publication Data
US 2015/0102701 A1   Apr. 16, 2015

(30) Foreign Application Priority Data
Oct. 11, 2013   (TW) ............................. 102136681 A

(51) Int. Cl.
    *H01L 29/84*   (2006.01)
    *B81B 3/00*    (2006.01)
(52) U.S. Cl.
    CPC .............. *B81B 3/007* (2013.01); *B81B 3/0013* (2013.01); *B81B 2203/0118* (2013.01)

(58) Field of Classification Search
    CPC ...................................................... H01L 29/84
    See application file for complete search history.

(56) References Cited

U.S. PATENT DOCUMENTS

| | | | |
|---|---|---|---|
| 8,513,041 B2 | 8/2013 | Wang et al. | |
| 2005/0077987 A1* | 4/2005 | Forehand | 335/78 |
| 2008/0290430 A1* | 11/2008 | Mahadevan et al. | 257/418 |
| 2010/0244160 A1* | 9/2010 | Kanemoto | 257/415 |
| 2010/0295138 A1* | 11/2010 | Montanya Silvestre et al. | 257/415 |
| 2010/0330722 A1* | 12/2010 | Hsieh | 438/53 |
| 2011/0024852 A1* | 2/2011 | Wang et al. | 257/418 |
| 2011/0233693 A1* | 9/2011 | Perruchot et al. | 257/417 |
| 2012/0056308 A1* | 3/2012 | Perruchot et al. | 257/618 |
| 2012/0235255 A1* | 9/2012 | Wang | G01L 9/0073 257/416 |
| 2012/0262026 A1* | 10/2012 | Lin et al. | 310/300 |
| 2013/0152688 A1* | 6/2013 | Sun et al. | 73/514.34 |

\* cited by examiner

*Primary Examiner* — Tan N Tran
*Assistant Examiner* — Fazli Erdem
(74) *Attorney, Agent, or Firm* — Tung & Associates

(57) ABSTRACT

The invention provides a MEMS device with enhanced structural strength. The MEMS device includes a plurality of metal layers, including a top metal layer with a plurality of metal segments. The metal segments are individually connected to an adjacent metal layer immediately under the top metal layer through at least one supporting pillar, and there is no dielectric layer between the metal segments and the adjacent metal layer immediately under the top metal layer. The metal layers except the top metal layer are respectively connected to their adjacent metal layers through at least one supporting pillar and a dielectric layer filling in between.

8 Claims, 8 Drawing Sheets

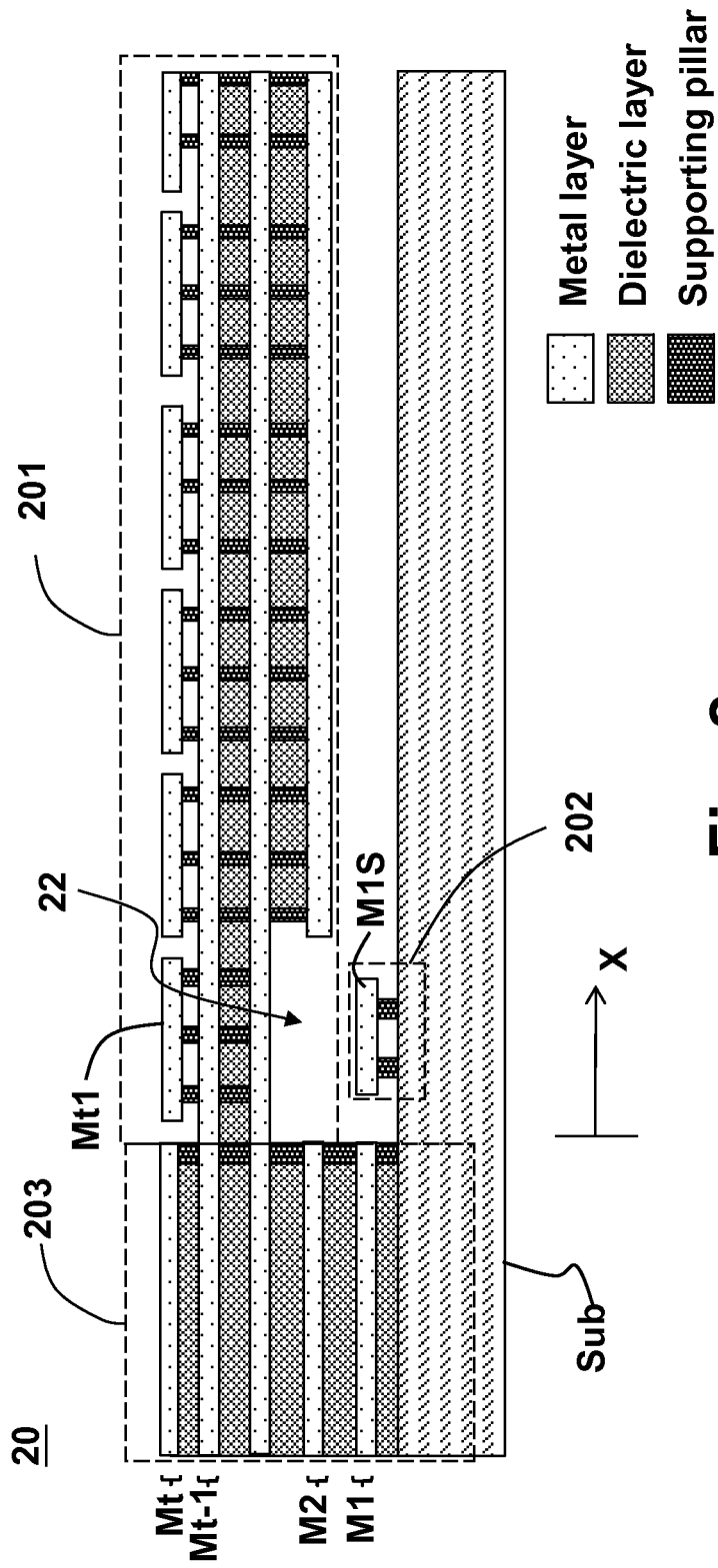
Fig. 2
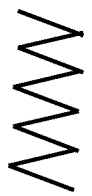
203 can be a spring

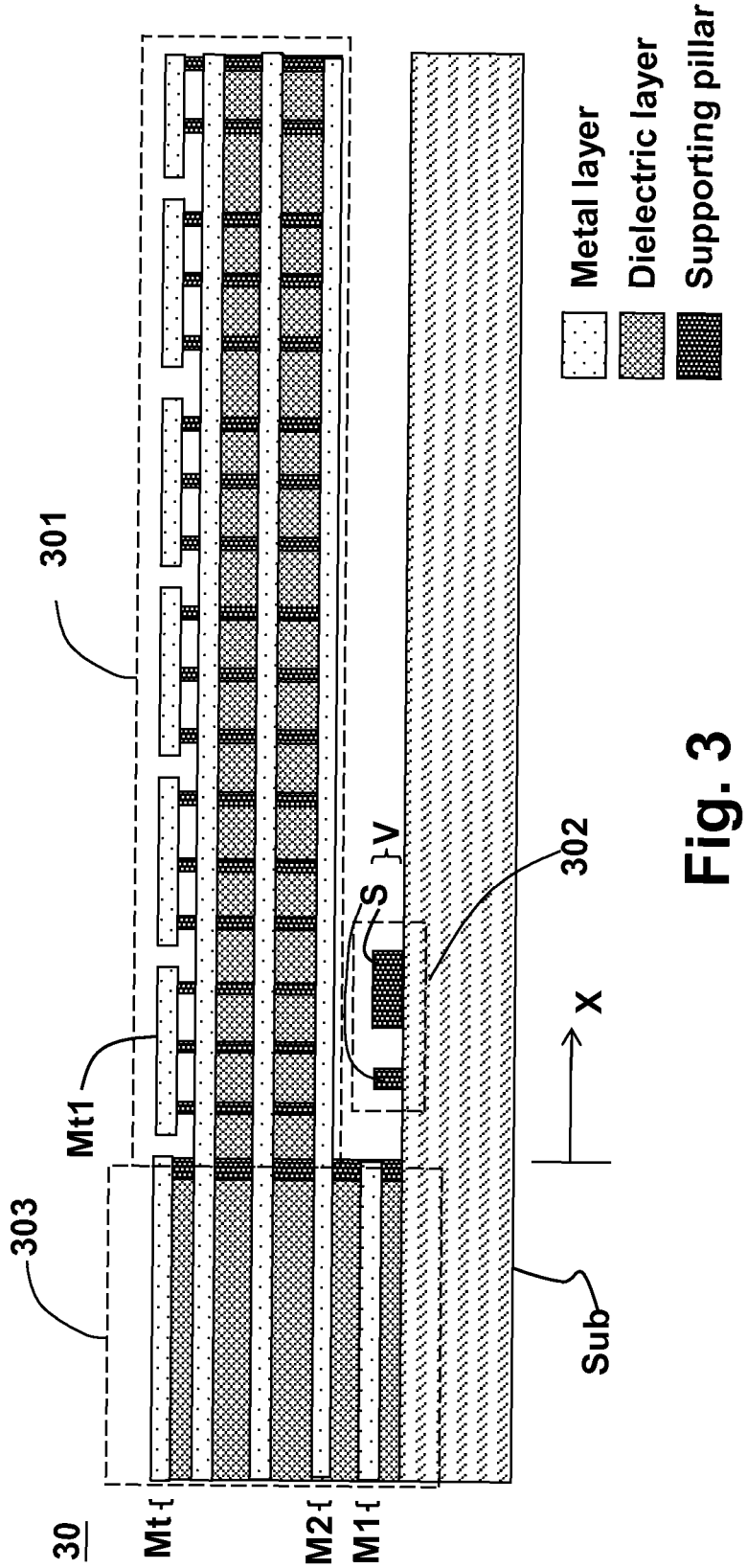
Fig. 3
303 can be a spring 

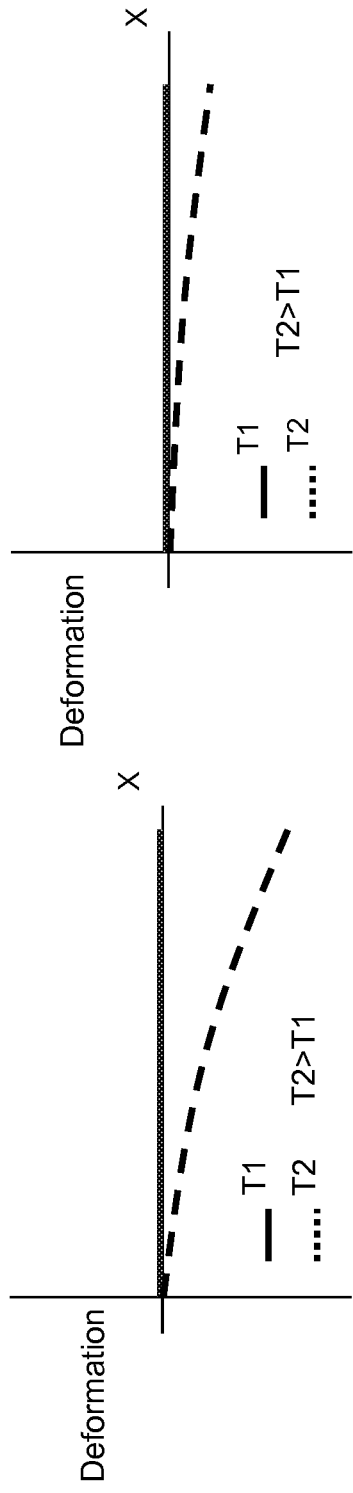

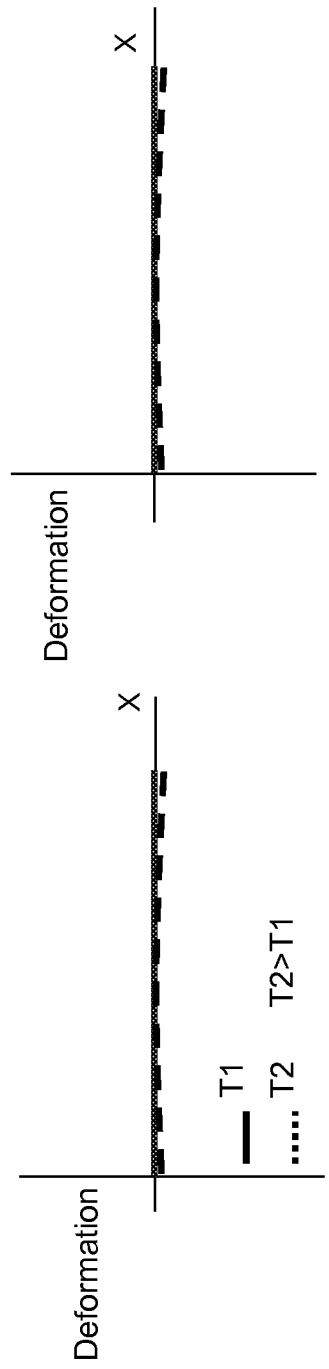

MICRO-ELECTRO-MECHANICAL SYSTEM DEVICE WITH ENHANCED STRUCTURAL STRENGTH

CROSS REFERENCE

The present invention claims priority to TW 102136681, filed on Oct. 11, 2013.

BACKGROUND OF THE INVENTION

1. Field of Invention

The present invention relates to a micro-electro-mechanical system (MEMS) device with enhanced structural strength, especially a MEMS device having a top metal layer with a plurality of metal segments and/or a lowest metal layer including a continuous structure.

2. Description of Related Art

FIG. 1 shows a prior art MEMS device 10, which for example can be used for a stator or a rotor. The MEMS device 10 includes a micro-electro-mechanical structure 101 and a signal transmission structure 102, wherein an operation of the MEMS structure 101 generates an electric signal and the electric signal is transmitted through the signal transmission structure 102. When the MEMS device 10 is a stator, the MEMS structure 101 for example can be connected to a substrate Sub through a fixing member 103. When the MEMS device 10 is a rotor, the MEMS structure 101 for example can be connected to the substrate Sub through a flexible member (shown schematically as a spring for example). The MEMS device 10 can be manufactured by a CMOS semiconductor manufacturing process, in which plural metal layers M1-Mt and plural dielectric layers are deposited and patterned on the substrate Sub, and plural via plugs are formed in the dielectric layers to connect the metal layers so as to form a designed structure.

The prior art MEMS device 10 has the following structure features:
1. The top metal layer Mt has a continuous structure.
2. The signal transmission structure 102 is formed by a portion M1S of the first metal layer M1; therefore, in order to prevent the signal transmitted through the signal transmission structure 102 from being affected by a nearby electric field and also avoid stiction which may occur in the manufacturing process and in the operation of the MEMS device, the second metal layer M2 has a disconnection area above the portion M1S to leave a buffer space. However, this recess weakens the strength of the MEMS structure 101.

When the strength of the MEMS structure 101 is not enough, it is liable to warp or distort. For example, when the environment temperature increases, the MEMS device 10 can easily deform to affect the performance of the MEMS device 10.

FIG. 6A shows deformation of the MEMS device 10 as the temperature increases. In the figure, the horizontal axis represents distance in the direction X of FIG. 1, and the vertical axis represents deformation, wherein the temperature T2 is higher than the temperature T1. As shown in the figure, the deformation at temperature T2 is higher than the deformation at temperature T1, and the deformation increases alone the direction X to an extent that can affect the stability of the structure and the function of the device in operation.

In view of the aforementioned deficiencies of the prior art, the present invention provides a MEMS device with enhanced structure strength whereby there is little or no deformation caused by temperature change or other reasons, to avoid stiction, maintain the structure stability, and improve the signal transmission performance.

SUMMARY OF THE INVENTION

In one perspective, the present invention discloses a MEMS device with enhanced structural strength, which includes: a MEMS structure, including a plurality of metal layers which include a top metal layer, the top metal layer including a plurality of metal segments which are not directly connected with one another; and a signal transmission structure under the MEMS structure for transmitting an electric signal generated by the MEMS structure; wherein each of the metal segments is individually connected to an adjacent metal layer through at least one supporting pillar, and there is no dielectric layer between the metal segments and the adjacent metal layer, and wherein except the top metal layer, the other metal layers are respectively connected to their adjacent metal layers through at least one supporting pillar, with a dielectric layer at least partially filling between two adjacent metal layers.

In one embodiment of the present invention, the MEMS device with enhanced structural strength further includes a fixing member or a flexible member connected to the MEMS structure.

In one embodiment of the present invention, the fixing member is connected to a lateral side of the MEMS structure.

In another embodiment of the present invention, the MEMS device further includes a recess under the MEMS structure at a location above the signal transmission structure.

In one embodiment, a lowest metal layer of the MEMS structure is continuous to the fixing member at the lateral side of the MEMS structure and does not have a disconnection area above the signal transmission structure.

In the aforementioned embodiment, preferably, the signal transmission structure does not comprise a metal layer as defined by CMOS manufacturing process terminology, and the signal transmission structure includes a conductive wiring at a level below the metal layer.

In one embodiment, the fixing member is connected to a bottom of the MEMS structure.

In the aforementioned embodiment, preferably, the MEMS device further includes a recess under the MEMS structure at a location above the signal transmission structure, wherein the recess is farther from the center of the MEMS structure than the fixing member is.

In another perspective, the present invention discloses a MEMS device with enhanced structural strength, which includes: a MEMS structure, including a plurality of metal layers; a fixing member, which is connected to a lateral side of the MEMS structure; and a signal transmission structure under the MEMS structure, for transmitting an electric signal generated by the MEMS structure; wherein a lowest metal layer of the MEMS structure is continuous to the fixing member at the lateral side of the MEMS structure and does not have a disconnection area above the signal transmission structure, and wherein the signal transmission structure does not comprise a metal layer as defined by CMOS manufacturing terminology and the signal transmission structure includes a conductive wiring at a level below the metal layer.

In another perspective, the present invention also discloses a MEMS device with enhanced structural strength, which includes: a MEMS structure, including a plurality of metal layers; a fixing member, which is connected to a bottom of the MEMS structure; and a signal transmission structure under the MEMS structure for transmitting an electric signal generated by the MEMS structure; wherein the MEMS structure further includes a recess under the MEMS structure at a location above the signal transmission structure, and the recess is farther from the center of the MEMS structure than the fixing member is.

The objectives, technical details, features, and effects of the present invention will be better understood with regard to the detailed description of the embodiments below, with reference to the drawings.

BRIEF DESCRIPTION OF THE DRAWINGS

FIG. 2 shows a MEMS device with enhanced structural strength according to an embodiment of the present invention.

FIG. 3 shows a MEMS device with enhanced structural strength according to another embodiment of the present invention.

FIGS. 6A-6E show deformation amounts of the MEMS devices of FIGS. 1-5, respectively.

DESCRIPTION OF THE PREFERRED EMBODIMENTS

Figure 1:
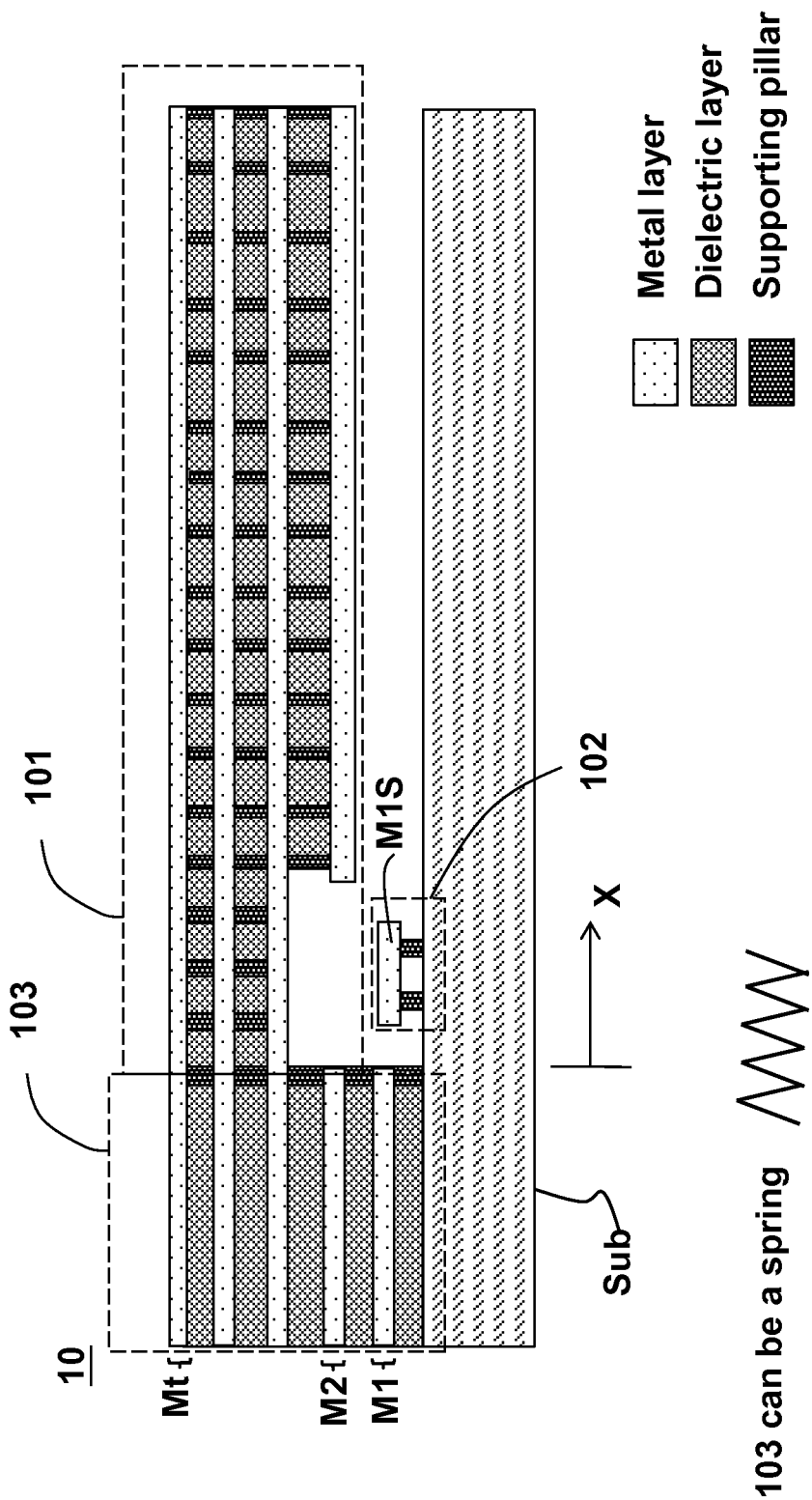
FIG. 1 shows a prior art MEMS device.

The drawings as referred to throughout the description of the present invention are for illustrative purpose only, to show the interrelations between the regions, layers and components, but not drawn according to actual scale. The orientation wordings in the description such as: above, under, left, or right are for reference with respect to the drawings, but not for limiting the actual product made according to the present invention.

FIG. 2 shows a MEMS device 20 with enhanced structural strength according to an embodiment of the present invention. The MEMS device with enhanced structural strength 20 includes a MEMS structure 201 and a signal transmission structure 202 under the MEMS structure 201, wherein the MEMS structure 201 generates an electric signal according to a relative movement with respect to other parts (not shown) of the device and the electric signal is transmitted through the signal transmission structure 202. The MEMS structure 201 includes plural metal layers M2-Mt; that is, from the second metal layer M2 to the top metal layer Mt. (By customary terminology in the CMOS semiconductor manufacturing process, after transistor devices and contacts to the gate, source and drain of the transistor device are formed, the next deposited metal layer is referred to as the first metal layer, and the second metal layer is the next metal layer to the first metal layer. Although the contacts to the gate, source and drain of the transistor device are made of metal, they are referred to as the "contact layer", not "metal layer".) The top metal layer Mt includes plural metal segments Mt1 which are not directly connected with one another; instead, each of the metal segments Mt1 is individually connected to an adjacent metal layer Mt-1 ("adjacent metal layer" means a metal layer that is immediately above or under; the metal layer Mt-1 is immediately under the top metal layer Mt) through at least one supporting pillar. In this embodiment, besides the at least one supporting pillar which connects a corresponding metal segment Mt1 to the adjacent metal layer Mt-1, there is no dielectric layer between the metal segments Mt1 and the adjacent metal layer Mt-1. The other metal layers (for example, from the second metal layer M2 to the metal layer Mt-1) are respectively connected to their adjacent metal layers through at least one supporting pillar, and there can be a dielectric layer at least partially filling (shown as fully filling in the figure) between two adjacent metal layers. The MEMS device 20 has an enhanced structure strength by the above structure; in particular, the deformation caused by a temperature increase can be reduced.

FIG. 6B shows deformation of the MEMS device 20 as the temperature increases. Compared with FIG. 6A, the deformation of the MEMS device 20 as shown in FIG. 6B is greatly reduced. Due to the reduced thermal deformation, the stiction is better avoided, and the structure stability and signal transmission performance of the device are also improved.

In one embodiment, the MEMS device 20 of FIG. 2 can be used for a stator or a rotor. When the MEMS device 20 is a stator, the MEMS structure 201 can be connected to a substrate Sub through a fixing member 203. When the MEMS device 20 is a rotor, the MEMS structure 201 can be connected to another part of the MEMS device 20 through a flexible member (shown schematically as a spring for example). The fixing member 203 for example can be formed by the metal layers M1-Mt and the dielectric layers. Note that what is shown in the figure is only one example. The fixing member 203 can have any shape and any height; for example, the fixing member 203 can be formed without the top metal layer Mt and the dielectric layer under it. In this embodiment, there is a recess 22 under the MEMS structure 201 at the location above the signal transmission structure 202, for forming a buffer space. That is, the lowest metal layer (M2 in this embodiment) of the MEMS structure 201 has a disconnection area above the lowest metal layer signal transmission structure 202. The dielectric layer above the lowest metal layer can also be partially removed (as shown by this embodiment), or the dielectric layer above the lowest metal layer can completely remain. The signal transmission structure 202 is formed by a portion M1S of the first metal layer M1.

FIG. 3 shows a MEMS device 30 with enhanced structural strength according to another embodiment of present invention. The major difference between the MEMS devices 20 and 30 is that the MEMS device 30 does not have the recess 22 of the MEMS device 20, and the signal transmission structure 302 of the MEMS device 30 is formed by conductive wirings S at a contact layer V without the first metal layer M1. Because the signal transmission structure 302 does not include the first metal layer (and any higher metal layer) and is composed of the conductive wirings S at a level below the first metal layer, leaving more room for the buffer space, the lowest metal layer (M2 in this embodiment) does not need to have a disconnection area above the signal transmission structure 302 at a location nearby the fixing member 301, and therefore the structure strength is enhanced. By customary terminology in the CMOS semiconductor manufacturing process, "contact layer" refers to a connection layer between the substrate Sub and the first metal layer M1, and the connection layers above the first metal layer M1 are usually referred to as "via layers". This embodiment removes the recess, which improves the structure strength of the MEMS device 30 to thereby reduce the thermal deformation. The material of the conductive wirings S for example can be metals such as tungsten, titanium, or their metal compounds. The conductive material wirings S can extend horizontally along any direction on the substrate Sub and are not limited to a column shape.

Similar to the embodiment of FIG. 2, the MEMS device 30 can be used for a stator or a rotor. When the MEMS device 30 is used for a stator, the MEMS structure 301 can be connected to the substrate Sub through a fixing member 303. When the MEMS device 30 is used for a rotor, the MEMS structure 301 can be connected to another part of the MEMS device 300 through a flexible member (shown schematically as a spring for example). That "the recess is removed" can be regarded as a direct and complete connection between the lowest metal layer M2 of the MEMS structure 301 and the fixing member 303 (or the flexible member). Note that the embodiments of FIGS. 2 and 3 show that the lowest metal layer of the MEMS structure 301 is the second metal layer M2, which is only an illustrative example but not for limiting the application of the present invention. The lowest metal layer of the MEMS structure can be a higher metal layer such as the third metal layer M3 or even higher, as the design is required or preferred.

FIG. 6C shows deformation of the MEMS device 30 as the temperature increases. Compared with FIG. 6A, the thermal deformation of the MEMS device 30 is much more reduced and even better than the embodiment of FIG. 6B.

Further, in the embodiment of FIG. 3, the feature that the recess is removed and that the signal transmission structure 302 does not include the first metal layer M1 can be implemented alone, independent of the disconnected metal segments Mt1; that is, the top metal layer Mt of the MEMS structure 301 can be a continuous structure as shown in FIG. 1.

Figure 4:
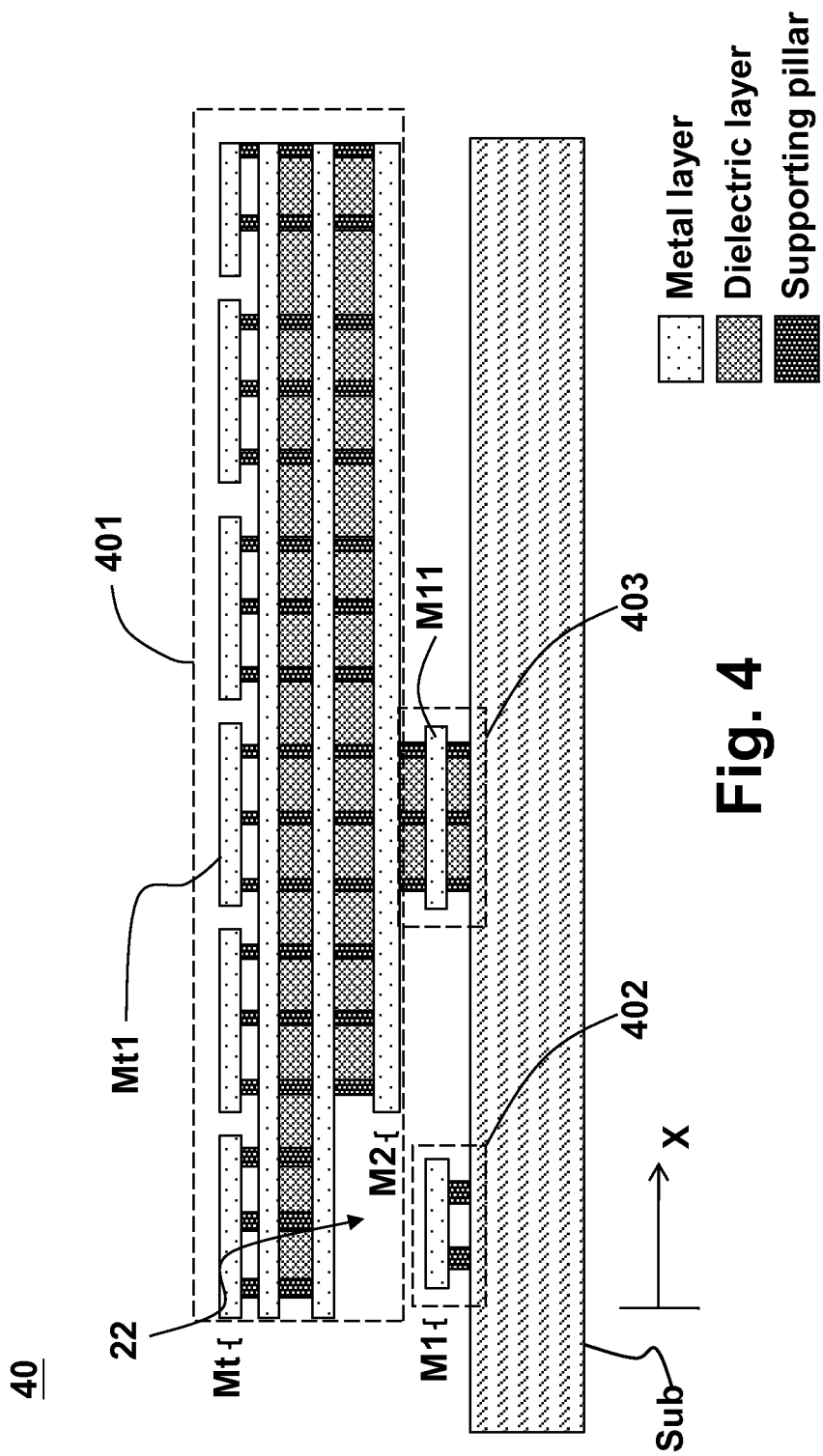
FIG. 4 shows a MEMS device with enhanced structural strength according to yet another embodiment of the present invention.

Referring to FIG. 4, according to another perspective, the present invention provides a MEMS device 40 with enhanced structural strength, which includes a MEMS structure 401, a signal transmission structure 402, and a fixing member 403. The MEMS structure 401 includes plural metal layers M2-Mt, namely, from the second metal layer M2 to the top metal layer Mt. The top metal layer Mt includes plural metal segments Mt1 and the metal segments Mt1 are not directly connected with each other; each of the metal segments Mt1 is individually connected to an adjacent metal layer Mt−1 ("adjacent metal layer" means a metal layer that is immediately above or under; the metal layer Mt−1 is immediately under the top metal layer Mt) through at least one supporting pillar, and there is no dielectric layer between the metal segments Mt1 and the adjacent metal layer Mt−1. The other metal layers (for example, from the second metal layers M2 to the metal layer Mt−1) are respectively connected to their adjacent metal layers through at least one supporting pillar, and there can be a dielectric layer at least partially filling (shown as fully filling in the figure) between two adjacent metal layers.

In this embodiment, the fixing member 403 is located under and connected to a bottom of the MEMS structure 401, not at a lateral side of the MEMS structure 401, which is different from the embodiment shown in FIG. 2. From top view, the fixing member 403 is located inside the MEMS structure 401. The fixing member 403 includes a portion (metal segment M11) of the first metal layer M1, one or more dielectric layers, and supporting pillars that connect the metal segment M11 to the MEMS structure 401 and the substrate Sub. Note that the locations and number of the supporting pillars show in the figure are for illustrative purpose only and can be modified. There is similarly a recess 22 under the MEMS structure 401 at the location above the signal transmission structure 402 to form a buffer space, and the recess 22 (or buffer space) is farther from the center of the MEMS structure 401 than the fixing member 403 is (in the embodiment of FIG. 2, the recess 22 or the buffer space is nearer to the center of the MEMS structure 201 than the fixing member 203 is).

Figure 5:
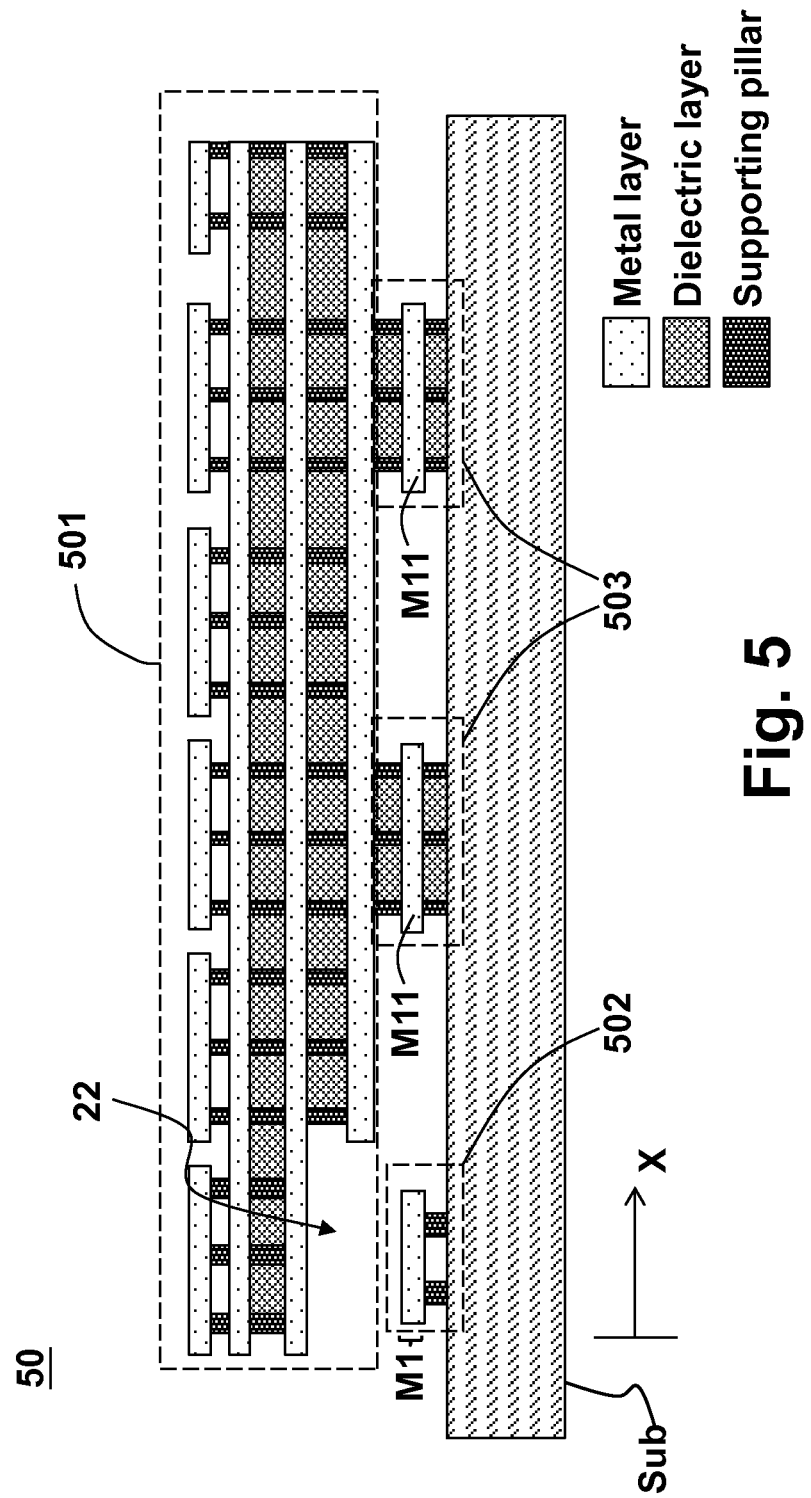
FIG. 5 shows a MEMS device with enhanced structural strength according to yet another embodiment of the present invention.

FIG. 5 shows a MEMS device 50 according to another embodiment of the present invention. This embodiment is different from the embodiment of FIG. 4 in that the MEMS device 50 includes plural metal segments M11 and thus plural fixing members 503 (two metal segments M11 and fixing members 503 as shown in the figure as a non-limiting example). Similar to the embodiment of FIG. 4, there is a recess 22 under the MEMS structure 501 at the location above the signal transmission structure 502 to form a buffer space. The recess 22 (or buffer space) is farther from the center of the MEMS structure 201 than the fixing member 503 is.

FIGS. 6D and 6E show deformation of the MEMS device 40 of FIG. 4 and deformation of the MEMS device 50 of FIG. 5 as the temperature increases, which show better performances of the MEMS devices 40 and 50 than FIG. 6A and even better than FIG. 6B. That is, FIGS. 6D and 6E illustrate that the MEMS devices 40 and 50 have more stable structures and therefore a better performance in electric signal transmission.

In the embodiments of FIGS. 4 and 5, the lowest metal layer of the MEMS structure is illustrated by the second metal layer M2 as an example; however, the lowest metal layer of the MEMS structure can be a higher metal layer such as the third metal layer M3 or even higher, as the design is required or preferred. In this case, the fixing members 403 and 503 can correspondingly include a portion of the first metal layer M1, a portion of the second metal layer M2 (and a portion of one or more even higher metal layers as the case may require), dielectric layers, and supporting pillars connecting within the MEMS structures 401 and 501 and connecting the MEMS structures 401 and 501 to the substrate Sub.

Further, in the embodiments of FIGS. 4 and 5, the feature that the recess 22 (or buffer space) is farther from the center of the MEMS structure 503 than the fixing member 503 is can be implemented alone, independent of the disconnected metal segments Mt1; that is, the top metal layer Mt of the MEMS structure 401 or 501 can be a continuous structure as shown in FIG. 1.

Figure 7:
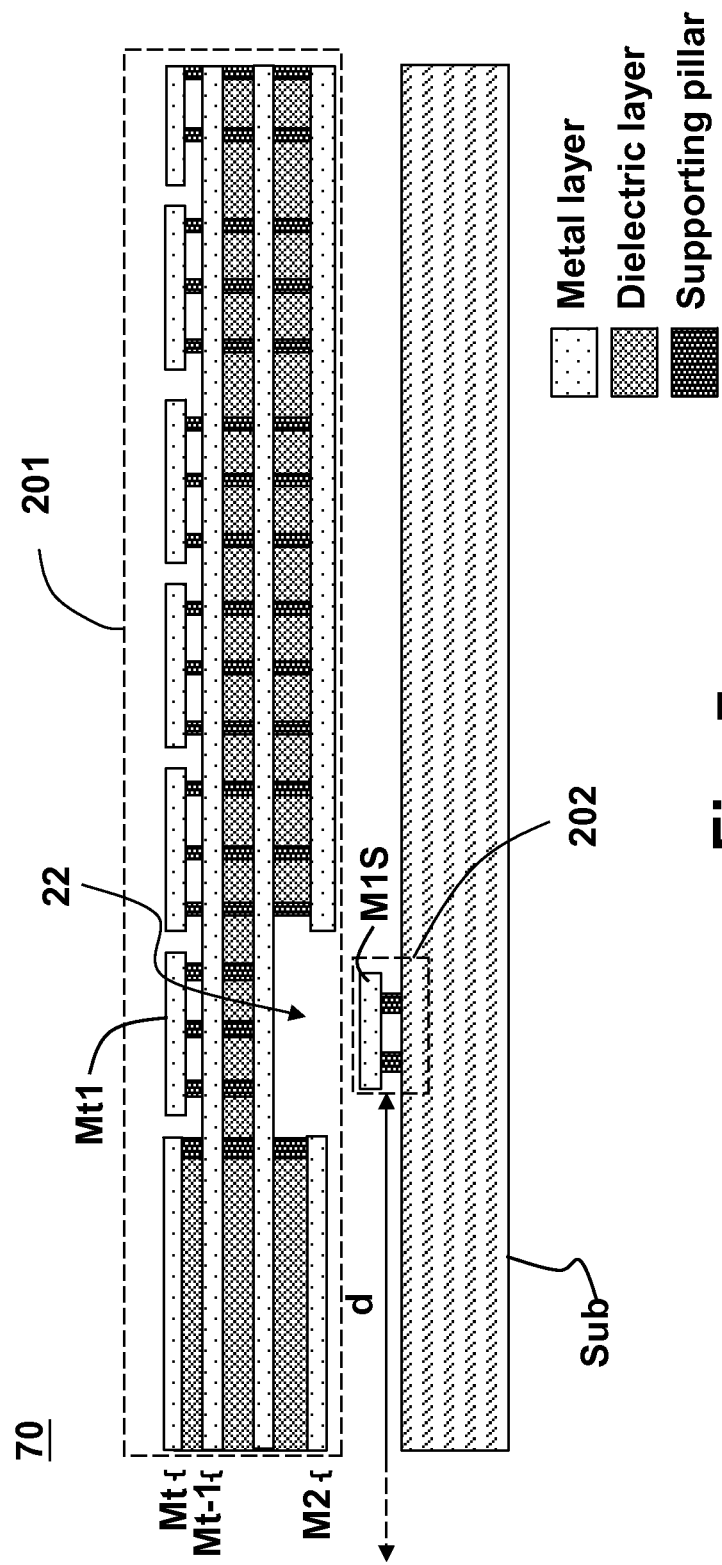
FIG. 7 shows a MEMS device with enhanced structural strength according to yet another embodiment of the present invention.

FIG. 7 shows a MEMS device 70 according to another embodiment of the present invention. Different from FIG. 2, the signal transmission structure 202 of the MEMS device 70 is not adjacent to the fixing member and has a considerable distance from the fixing member 203 (therefore, the fixing member is not shown in figure). For example, this distance d can be larger than three times of the size of the fixing member in the shown direction. In this embodiment, the fixing member can be connected to a lateral side of the MEMS structure 201 as shown in FIG. 2, or connected to a bottom of the MEMS structure 201 as shown in FIGS. 4 and 5.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. Therefore, all these and other modifications should fall within the scope of the present invention. An embodiment or a claim of the present invention does not need to attain or include all the objectives, advantages or features described in the above. The abstract and the title are provided for assisting searches and not to be read as limitations to the scope of the present invention.

What is claimed is:

1. A MEMS device with enhanced structural strength, comprising:
   a MEMS structure, including a plurality of metal layers which include a top metal layer, the top metal layer including a plurality of metal segments which are not directly connected with one another; and a signal transmission structure under the MEMS structure for transmitting an electric signal generated by the MEMS structure;

wherein each of the metal segments is individually connected to an adjacent metal layer through at least one supporting pillar, and there is no dielectric layer between the metal segments and the adjacent metal layer, and wherein except the top metal layer, the other metal layers are respectively connected to their adjacent metal layers through at least one supporting pillar, with a dielectric layer at least partially filling between two adjacent metal layers.

2. The MEMS device with enhanced structural strength of claim 1, further comprising a fixing member or a flexible member connected to the MEMS structure.

3. The MEMS device with enhanced structural strength of claim 2, wherein the fixing member is connected to a lateral side of the MEMS structure.

4. The MEMS device with enhanced structural strength of claim 3, further comprising: a recess under the MEMS structure at a location above the signal transmission structure.

5. The MEMS device with enhanced structural strength of claim 3, wherein a lowest metal layer of the MEMS structure is continuous to the fixing member at the lateral side of the MEMS structure and does not have a disconnection area above the signal transmission structure.

6. The MEMS device with enhanced structural strength of claim 5, wherein the signal transmission structure does not comprise a metal layer as defined by CMOS manufacturing process terminology and the signal transmission structure includes a conductive wiring at a level below the metal layer.

7. The MEMS device with enhanced structural strength of claim 2, wherein the fixing member is connected to a bottom of the MEMS structure.

8. The MEMS device with enhanced structural strength of claim 7, further comprising: a recess under the MEMS structure at a location above the signal transmission structure, wherein the recess is farther from the center of the MEMS structure than the fixing member is.

* * * * *